(12) United States Patent
Zhang (10) Patent No.: US 6,538,708 B2
(45) Date of Patent: Mar. 25, 2003

(54) LIQUID CRYSTAL DISPLAY WITH STATIC DISCHARGE CIRCUIT

(75) Inventor: Hongyong Zhang, Kawasaki (JP)

(73) Assignee: Fujitsu Display Technologies Corporation, Kawasaki (JP)

(*) Notice: Subject to any disclaimer, the term of this patent is extended or adjusted under 35 U.S.C. 154(b) by 0 days.

(21) Appl. No.: 09/316,757

(22) Filed: May 21, 1999

(65) Prior Publication Data
US 2002/0080292 A1 Jun. 27, 2002

(30) Foreign Application Priority Data
Nov. 17, 1998 (JP) .......................... 10-326418

(51) Int. Cl.[7] .............................. G02F 1/1333
(52) U.S. Cl. ........................... 349/40; 349/54
(58) Field of Search ............... 439/42, 40; 349/139, 349/42, 40, 43, 54

(56) References Cited

U.S. PATENT DOCUMENTS

| 5,648,685 A | * | 7/1997 | Misawa et al. ............. 257/775 |
| 6,051,453 A | * | 4/2000 | Takemura ................... 438/166 |
| 6,104,449 A | * | 8/2000 | Takahashi et al. ............ 349/40 |
| 6,168,980 B1 | * | 1/2001 | Yamazaki et al. ........... 438/162 |
| 6,175,394 B1 | * | 1/2001 | Wu et al. ..................... 349/40 |

FOREIGN PATENT DOCUMENTS

| JP | 03-132723 | 6/1991 |
| JP | 03-165562 | 7/1991 |
| JP | 04-295826 | 10/1992 |
| JP | 06-75246 | 3/1994 |
| JP | 08-179358 | 4/1996 |
| JP | 09-160073 | 6/1997 |
| JP | 08-146460 | 4/1998 |
| JP | 10-020336 | 11/2001 |

OTHER PUBLICATIONS

Bahadur Birendra, "Liquid Crystal Applicantions and Uses, vol. 1, pp. 412–413.*

* cited by examiner

Primary Examiner—William L. Sikes
Assistant Examiner—Dung Nguyen
(74) Attorney, Agent, or Firm—Greer, Burns & Crain, Ltd

(57) ABSTRACT

A liquid crystal display includes a pixel cell array formed on a substrate. The pixel cell array includes rows and columns of pixel cells and each pixel cell has a pixel TFT. Gate control lines extend along the respective rows of the pixel cell array and connect the pixel TFTs to a gate control circuit. A termination unit is located near one end of the gate control lines. The termination unit is made up of antenna TFTs, respectively connected to the gate control lines. The antenna TFTs have a size which is much larger than a size of the pixel TFTs and are preferably CMOS type TFTs. The termination unit discharges a static charge which may build up on the gate control lines so that damage to the pixel TFTs caused by the static charge is prevented.

19 Claims, 10 Drawing Sheets

LIQUID CRYSTAL DISPLAY WITH STATIC DISCHARGE CIRCUIT

BACKGROUND OF THE INVENTION

The present invention relates to an active matrix liquid crystal display (AM-LCD) which employs thin film transistors (TFTs).

AM-LCDs are extensively used in electronic instruments, such as personal computers and the like. In an AM-LCD, thin film transistors are formed on a highly insulating substrate. This causes the substrate to be liable to be charged by static electricity, which can change the thin film transistors.

Figure 1:
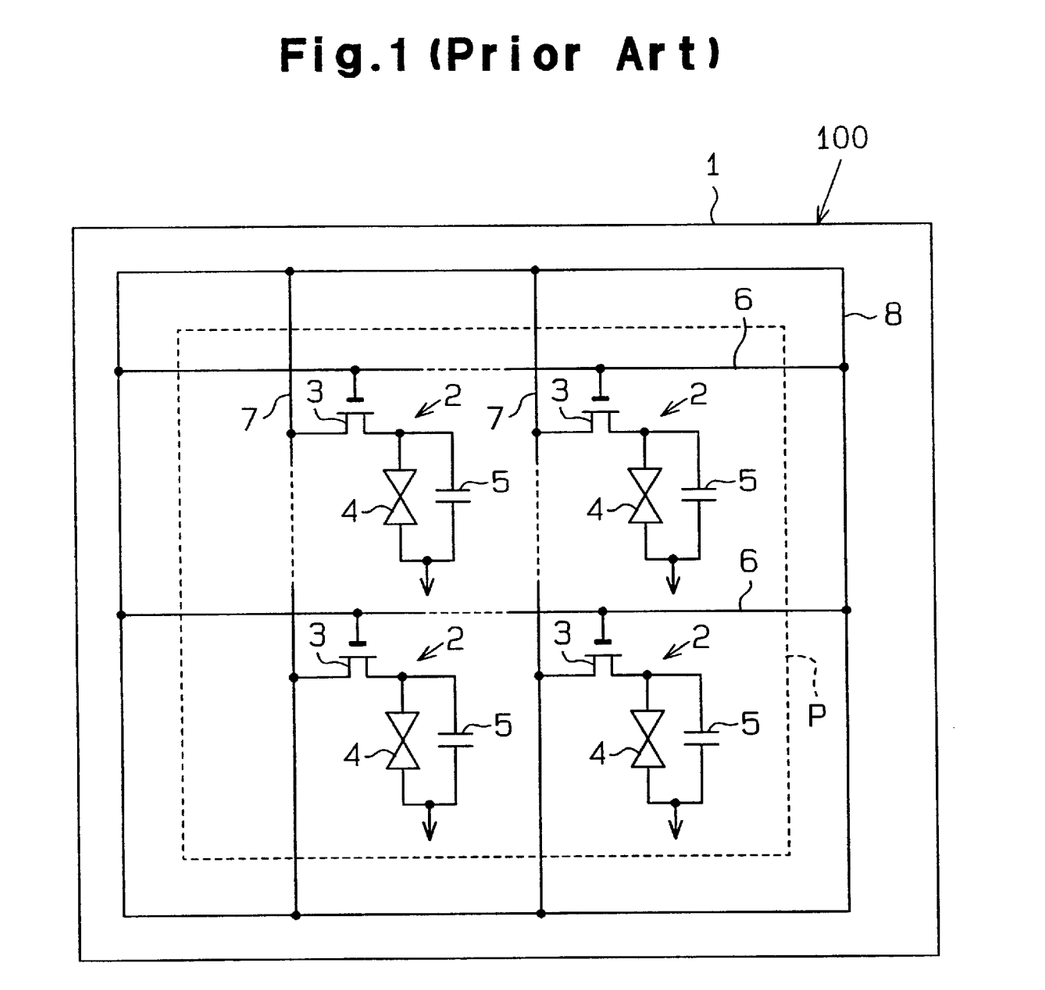
FIG. 1 is a schematic diagram of a first prior art AM-LCD.

A first prior art AM-LCD 100 having an anti-electrostatic destruction structure will be described with reference to FIG. 1. The AM-LCD 100 comprises an amorphous silicon (a-Si) substrate 1, a plurality of picture element (pixel) cells 2 disposed in a plurality of rows and columns on the substrate 1, a plurality of gate control lines 6 and data lines 7 which are connected to the pixel cells 2, and a shorting ring wiring 8 connected to both of the lines 6 and 7. The plurality of pixel cells 2 form a pixel cell array. Each pixel cell 2 includes a TFT 3, a liquid crystal 4 and a capacitor 5.

The gate control lines 6 are disposed on the substrate 1 and extend along the rows of pixel cells 2 and the data lines 7 are disposed on the substrate 1 and extend along the columns of pixel cells 2. The TFT 3 has a drain connected to the liquid crystal 4 and the capacitor 5, a gate connected to the gate control line 6 and a source connected to the data line 7.

The shorting ring wiring 8 extends around the edges of the substrate 1, and is formed by substantially the same process used to form the gate control lines 6 and the data lines 7. In the latter process, the gate control lines 6 are formed before the data lines 7 are formed. After forming the pixel cells 2, the edges of the substrate 1 are severed along a cutting line P located inside the shorting ring wiring 8 prior to conducting a panel test and a TAB mounting step. The wiring 8 is thus severed from the gate control lines 6 and the data lines 7.

In the manufacturing step or steps which occur between forming and severing the shorting ring wiring 8, the gate control lines 6 and the data lines 7 are shorted together via the shorting ring wiring 8. Thus, if the substrate 1 is charged by static electricity, causing either the gate control line 6 or the data line 7 to assume a high potential, by antenna effect, any potential difference between the gate and the source of the TFT 3 is eliminated by the shorting ring wiring 8, which prevents electrostatic destruction of the pixel cell 2 between the gate and the source electrode from occurring.

Figure 2:
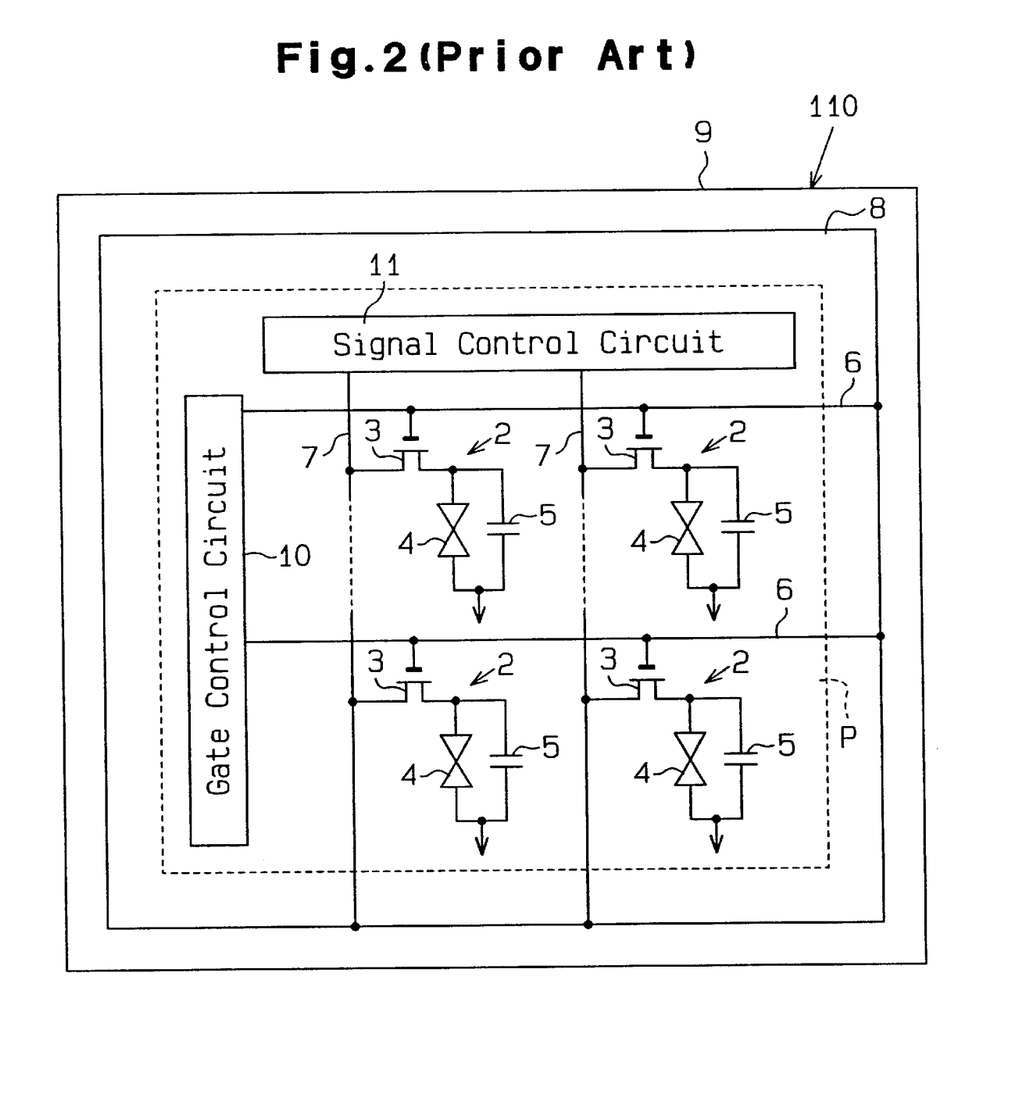
FIG. 2 is a schematic diagram of a second prior art AM-LCD.

A second prior art AM-LCD 110 using a polysilicon (p-Si) substrate 9 will now be described with reference to FIG. 2. The AM-LCD 110, in addition to the components of the AM-LCD 100, includes a gate control circuit 10 and a signal control circuit 11 disposed on a peripheral region of the polysilicon substrate 9.

The gate control line 6 has first end connected to the gate control circuit 10 and a second end connected to the shorting ring wiring 8. Similarly, the data line 7 has a first end connected to the signal control circuit 11 and a second end connected to the shorting ring wiring 8. As in the first example, the shorting ring wiring 8 is severed along the cutting line P and separated from the gate control lines 6 and the data lines 7. Again, the shorting ring wiring 8 acts to prevent electrostatic destruction of the pixel cell 2 between the gate and the source electrode from occurring.

However, electrostatic destruction is not satisfactorily prevented by the AM-LCD's, 110 for the reasons mentioned below.

(1) The electrostatic destruction of the TFT 3 across the gate and the source electrode may be prevented, but a potential difference between the gate electrode and the drain electrode to which the liquid crystal 4 and the capacitor 5 are connected is not eliminated, and thus may cause electrostatic destruction across the drain and the gate electrode of the TFT 3.

(2) The provision of the shorting ring wiring 8 is effective only from the step of forming the gate control lines 6 and the data lines 7 to the step of severing the substrate 1, 9 along the cutting line P. However, the gate control lines 6 are formed by a wiring layer which is distinct from a wiring layer forming the data lines 7. Normally the gate control lines 6 are formed first, and then the data lines 7 are formed. Accordingly, static electricity may be generated on the substrate 1, 9 after the gate control lines 6 are formed, but before the data lines 7 are formed. If the antenna effect causes the gate control line 6 to assume a high potential, the electrostatic destruction of TFT 3 may occur between the gate electrode and either the source or the drain electrode.

(3) As substrate 1, 9 is severed along the cutting line P, the gate control lines 6 and the data lines 7 are exposed at the edges of the substrate 1, 9, and accordingly, it is possible for static electricity to reach the gate control lines 6 and the data lines 7 and cause electrostatic destruction of the TFT 3 during the step of mounting the substrate 1, 9. A substrate without a frame has recently been used in electronic instruments to achieve a reduction in the size and weight thereof. In these circumstances, the exposed ends of the gate control lines 6 or the data lines 7 provide an access port for static electricity.

(4) In the step of severing the shorting ring wiring 8, static electricity may be generated as the substrate 1, 9 is severed, and damage the TFT 3. The gate control lines 6 on the substrate 9 are connected to an output stage of the gate control circuit 10 and the data lines 7 are connected to an output stage of the signal control circuit 11. Accordingly, the output stage of either the gate control circuit 10 or the signal control circuit 11 may be subject to electrostatic destruction during the step of severing the shorting ring wiring 8.

(5) It has been proposed to sever the shorting ring wiring 8 on the substrate 1, 9 with a laser to prevent exposure of the gate control lines 6 and the data lines 7 at the edges of the substrate. It has also been proposed to seal the edges of the substrate 1, 9 with synthetic resin to provide an electrical insulation. However, the implementation of such steps requires a modification of the manufacturing process, increasing the manufacturing cost.

(6) It has also been proposed that the gate control lines 6 and the data line 7 be exposed at the edges of the substrate 1, 9 via interposed elements which serve as resistors for the static electricity. However, these elements are not effective in preventing electrostatic destruction in a satisfactory manner.

SUMMARY OF THE INVENTION

It is an object of the invention to provide a liquid crystal display which has a high reliability in guarding against the static electricity.

In one aspect of the present invention, a liquid crystal display includes a substrate, a pixel cell array disposed on the substrate, a plurality of gate control lines, a plurality of data lines, and a termination unit. The pixel cell array includes a plurality of pixel TFTs arranged in rows and columns. Each of the gate control lines has a first end and a second end, and extends along a respective row of the pixel cell array and is connected to the pixel TFTs of that row. Each of the data lines extends along a respective column of the pixel cell array and is connected to the pixel TFTs of that column. The termination unit is connected to the pixel TFTs by way of the gate control lines. The termination unit discharges static electricity from the gate control lines such that damage to the pixel TFTs caused by static electricity is prevented.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 3:
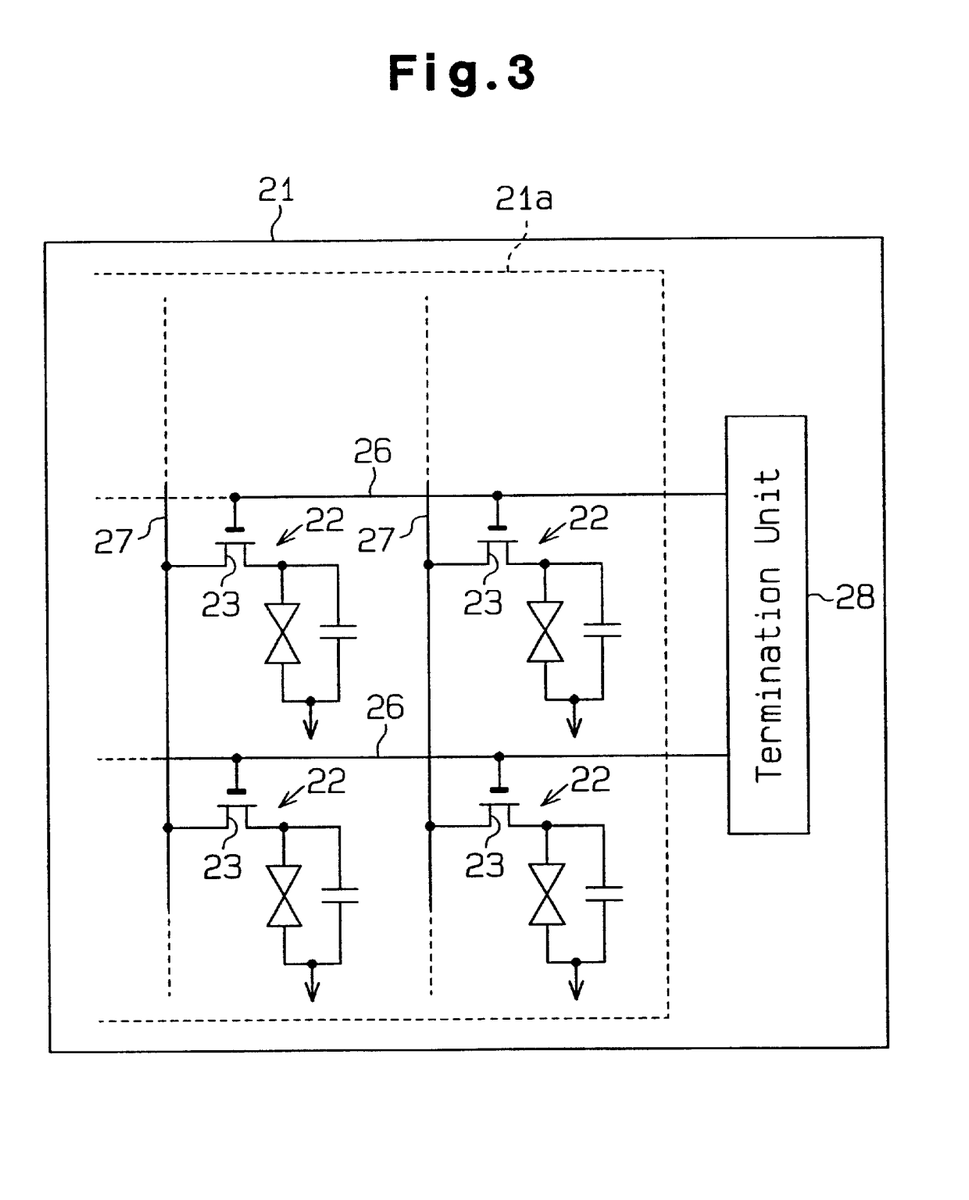
FIG. 3 is a schematic diagram of an AM-LCD illustrating the present invention.

Initially, referring to FIG. 3, an overview of the present invention will be provided. An AM-LCD 200 according to the present invention comprises a substrate 21, a pixel cell array 21a disposed on the substrate 21, and a termination unit 28 connected to the pixel cell array 21a. The array 21a includes a plurality of pixel cells 22, and gate control lines 26 and data lines 27 which are connected to the respective pixel cells 22. Each pixel cell 22 includes a pixel TFT 23 connected to one of the gate control lines 26 and one of the data lines 27. The termination unit 28 is connected to the respective pixel TFT's 23 via the gate control lines 26. If any one of the gate control lines 26 is charged by static electricity, such static electricity is neutralized (or discharged) via the termination unit 28 such that electrostatic destruction of the pixel TFT 23 is prevented.

First Embodiment

Figure 4:
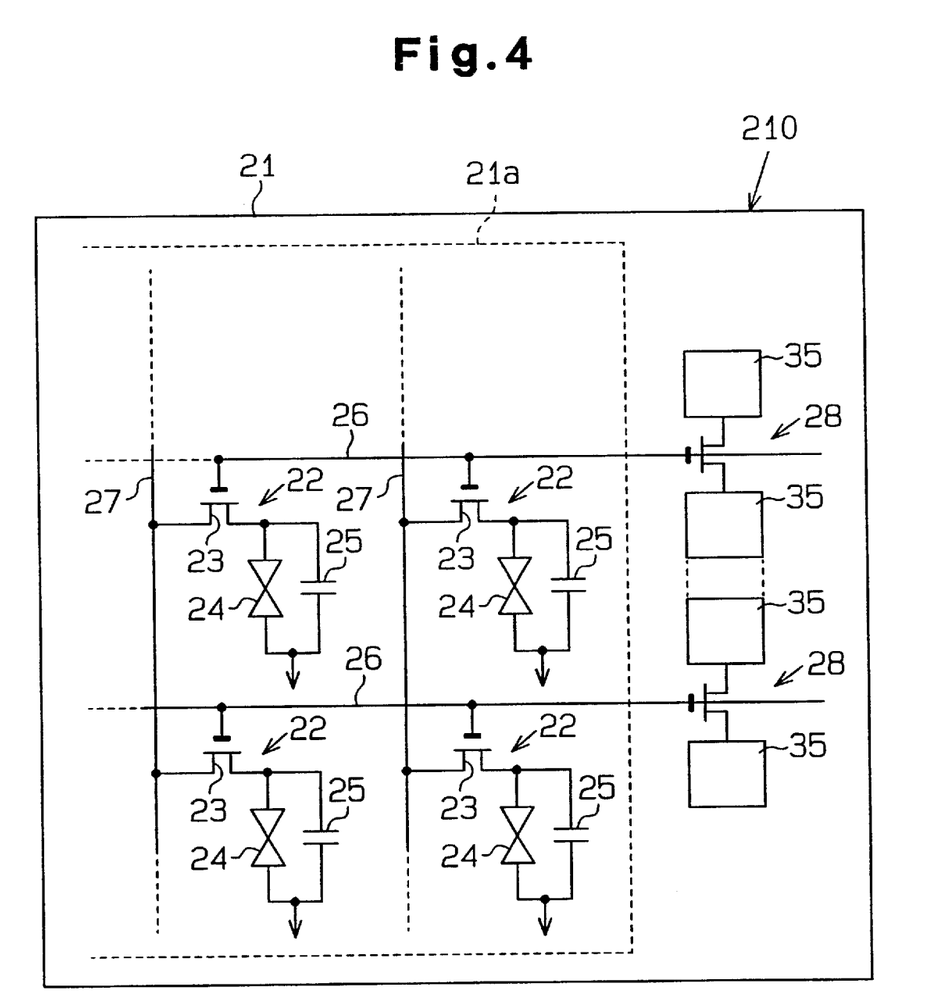
FIG. 4 is a schematic diagram of an AM-LCD according to a first embodiment of the present invention.

An AM-LCD 210 according to a first embodiment of the present invention will now be described with reference to FIGS. 4 and 5. The AM-LCD 210 comprises the pixel cell array 21a disposed on the substrate 21, and a plurality of antenna-TFTs 28 connected to the pixel cell array 21a. The pixel cell array 21a includes a plurality of pixel cells 22 arranged in rows and columns. The array 21a includes a plurality of gate control lines 26 extending along the rows and a plurality of the data lines 27 extending along the columns. The pixel cells 22 each comprise an amorphous silicon (a-Si) TFT (hereafter referred to as a pixel TFT) 23 which is connected to both of the gate control line 26 and the data line 27, a liquid crystal 24 and a capacitor 25. Each pixel TFT 23 comprises a drain connected to the liquid crystal 24 and the capacitor 25, a gate connected to the gate control line 26 and a source connected to the data line 27.

Each gate control line 26 has a terminal end which extends to the exterior of the pixel cell array 21a, where it is connected to one of the antenna-TFTs 28. The antenna-TFT 28 has a size which is far greater than the size of the pixel TFT 23. As shown in FIG. 5, disposed near the terminal end of the gate control line 26 are a P-type impurity doped semiconductor layer 29 and an N-type impurity doped semiconductor layer 30 both of which extend in a direction orthogonal to the gate control line 26. Both of the P-type and N-type semiconductor layers 29, 30 each has an area which is larger than the pixel TFT 23 by a factor of several tens or greater. A metal electrode 35 is disposed over the P- and N-type semiconductor layers 29, 30.

Figure 6A:
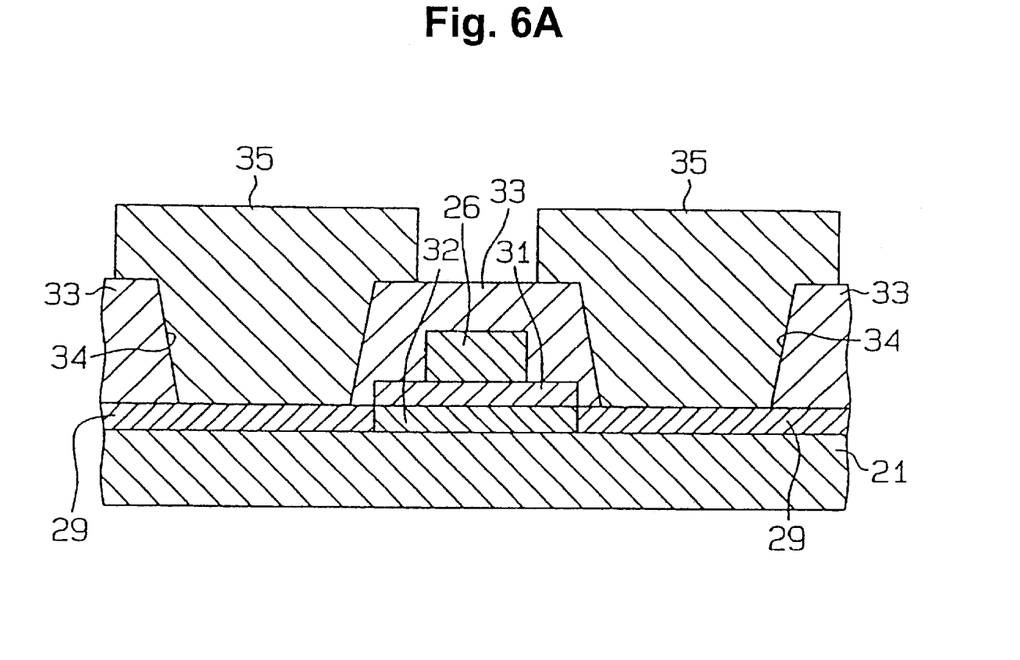
FIG. 6A is a cross-sectional view of an antenna-TFT of the termination unit of FIG. 5 taken along line 6A—6A.
Figure 6B:
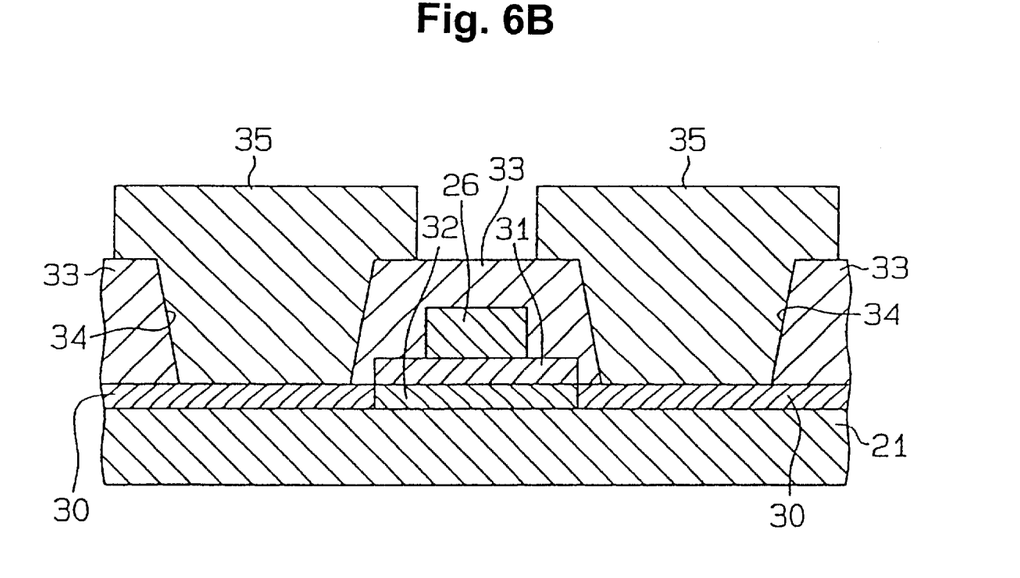
FIG. 6B is a cross-sectional of an antenna-TFT of the termination unit of FIG. 5 taken along line 6B—6B.

Referring to FIGS. 6A and 6B, the antenna-TFT comprises a gate insulating film 31 disposed below the gate control line 26 which serves as a gate electrode, an active layer 32 disposed below the gate insulating film 31. The impurity doped semiconductor layers 29 and 30 are disposed on the opposite sides of the gate control 26, and the gate control line 26 and the gate insulating film 31 are covered by an interlayer insulating film 33. The interlayer insulating film 33 has contact holes 34 at locations over the impurity doped semiconductor layers 29 and 30. The metal electrodes 35, which are formed as discharge pads, are disposed in the contact holes 34. Thus, the antenna-TFT 28 is a CMOS TFT having P- and N-type impurity doped semiconductor layers 29 and 30.

A method of manufacturing the antenna-TFT 28 will now be described. The antenna-TFT 28 is preferably formed concurrently with the pixel TFT 23.

The active layer 32 is initially formed on the silicon substrate 21, and the gate insulating film 31, which preferably comprises a nitride film or an oxide film, is formed on the active layer 32.

The gate control line 26, which serves as the gate electrode for the antenna-TFT 28, is formed on top of the gate insulating film 31. The N-type impurity doped semiconductor layer 30 and the P-type impurity doped semiconductor layer 29 are sequentially formed on the opposite sides of the gate control line 26 (or the active layer 32) and serve as source/drain regions of the antenna-TFT 28. Preferably, both of the semiconductor layers 29 and 30 are formed by a doping step or a plasma step.

Subsequently, the interlayer insulating film 33, which preferably comprises a nitride film or an oxide film, is formed on the semiconductor layers 29 and 30 and the gate control line 26. The interlayer insulating film 33 is formed with the contact holes 34 therein, in which the metal electrode 35 is formed. When the data lines 27 within the pixel cell array 21a are formed, the metal electrodes 35 are patterned to define a predetermined spacing between adjacent metal electrodes 35. In this manner, each of the metal electrodes 35 is formed to be independently floating over the associated impurity doped semiconductor layer 29 or 30. As a consequence, the respective metal electrodes 35 and the impurity doped layers 29 and 30 act as discharge pads.

Figure 5:
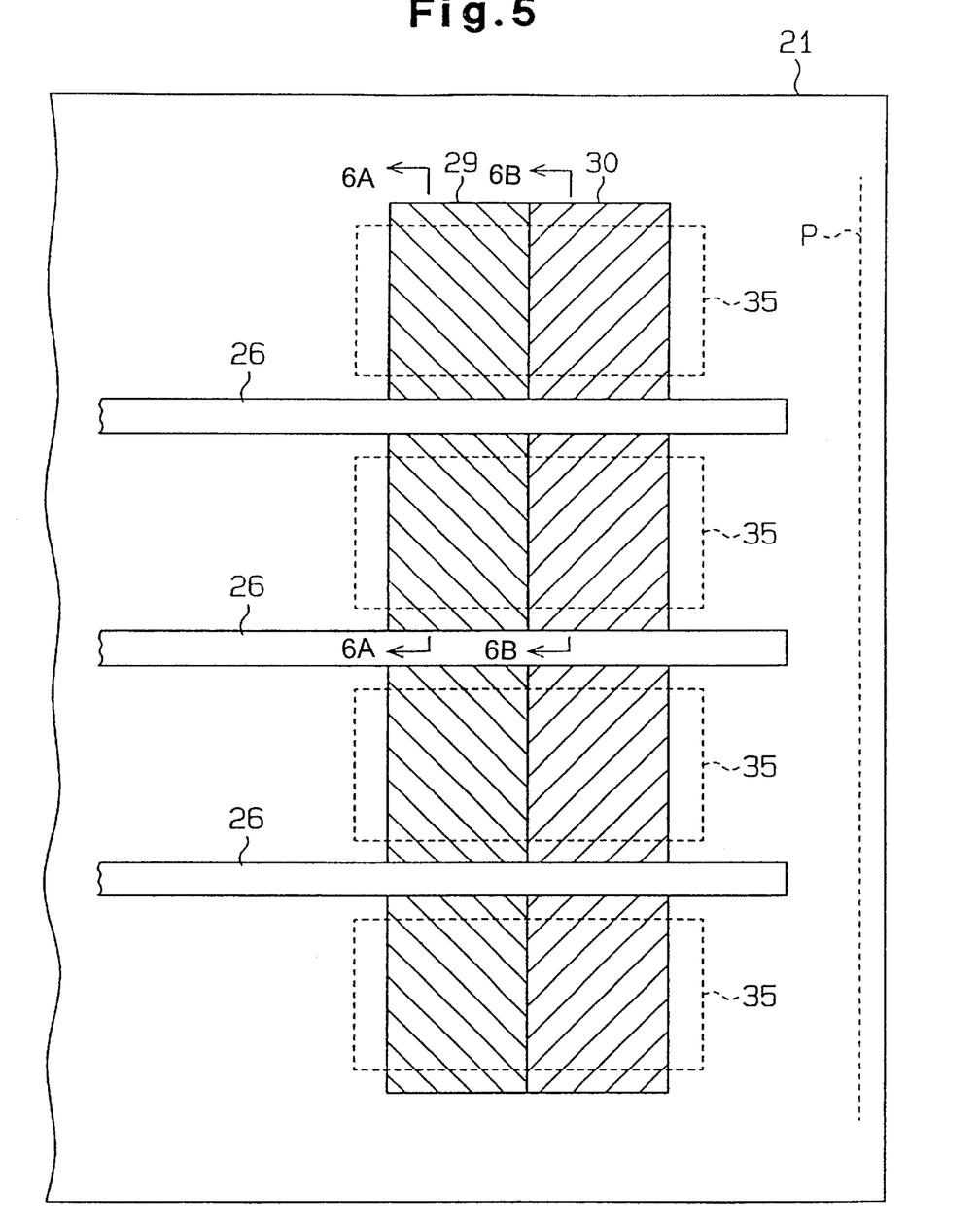
FIG. 5 is a plan view of a termination unit of the AM-LCD of FIG. 4.

After the formation of the antenna-TFT 28, the substrate 21 is severed along a cutting line P of FIG. 5, which is chosen to be located outside the pixel cell array 21a and the antenna-TFT's 28 and also located externally of the terminal end of the gate control line 26.

After the substrate 21 is severed, a panel test which checks the operation of each pixel cell 22 on the substrate 21 is conducted. Subsequently, a TAB mounting step is conducted in which a peripheral circuit is connected to the substrate, and the AM-LCD 210 is completed subsequent to an assembly step.

The AM-LCD 210 constructed in the manner mentioned above has the following advantages:

The gate control line 26 is shared by the pixel TFT 23 and the antenna-TFT 28, and the antenna-TFT 28 is sized such that it is much larger than the pixel TFT 23.

Accordingly, in the event the gate control line 26 is charged by static electricity, the charge of the static electricity is neutralized (discharged) from the gate electrode of the antenna-TFT 28 toward the impurity doped semiconductor layer 29 or 30 via the gate insulating film 31 and the active layer 32. This prevents the electrostatic destruction of the pixel TFT 23 due to the static electricity on the gate control line 26. This prevents the gate control line 26 from being charged by the static electricity, such that a potential difference between the gate and the drain electrode of the pixel TFT 23 is eliminated, thus preventing an electrostatic destruction across the electrodes.

The static electricity which charges the gate control line 26 due to the antenna effect of the gate control line 26 is likely to be generated in the following steps, subsequent to the formation of the pixel TFT 23 and the antenna-TFT 28: a plasma step for forming an interlayer insulating film or the like, an anisotropic etching step for forming contact holes in the impurity doped semiconductor layer or source/drain region of each TFT 23 or 28, and a sputtering step for forming a metal wiring. If the gate control line 26 is charged by static electricity during any one of these steps, the resulting charge leaks to the antenna-TFT 28 so that an electrostatic destruction of the pixel TFT 23 is prevented.

It will be noted that the N- and P-type impurity doped semiconductor layers 29 and 30 of the antenna-TFT 28 are formed adjacent to each other, so that if the gate control line 26 is charged to either a positive or a negative potential by the static electricity, the resulting charge in either instance is neutralized to either impurity doped semiconductor layer 29 or 30.

After the substrate 21 is severed, the terminal end of the gate control line 26 is not exposed at the severed edge of the substrate 21. Accordingly, the static electricity cannot sneak onto the gate control line 26 during the assembly step of the substrate 21.

If an electric pulse is generated sporadically on the gate control line 26 due to an abnormal discharge during the plasma step, the resulting abnormal current flows to either impurity doped semiconductor layer 29 or 30 of the antenna-TFT 28. In such instance, the antenna-TFT 28 will be damaged prior to any damage to the pixel TFT 23, thus protecting the pixel TFT 23 from being damaged.

Second Embodiment

An AM-LCD according to a second embodiment is preferred for alleviating a loading on the gate control line 26 by the antenna-TFT 28 during use of the AM-LCD. This is because the metal electrodes 35 and the impurity doped semiconductor layers 29 and 30 of the antenna-TFT 28 are removed at the same time as a source/drain wiring for the pixel TFT 23 is formed.

Figure 7A:
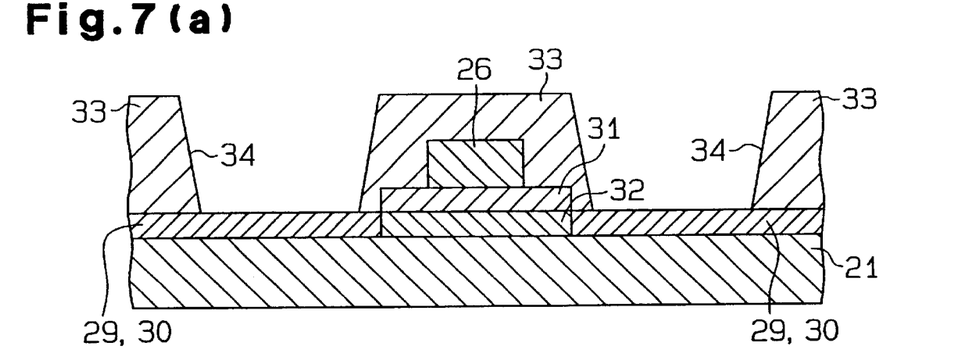
FIGS. 7(a) to 7(c) are cross-sectional views illustrating a method of manufacturing a termination unit according to a second embodiment of the present invention.

Steps used to manufacture the AM-LCD according to the second embodiment will now be described with reference to FIGS. 7(a) to 7(c). As shown in FIG. 7(a), the gate control line 26, impurity doped semiconductor layers 29 and 30, gate insulating film 31 and active layer 32 are formed on the substrate 21. The interlayer insulating film 33 is formed to separate the gate and the source/drain electrodes, and is formed the contact holes 34 therein.

Figure 7B:
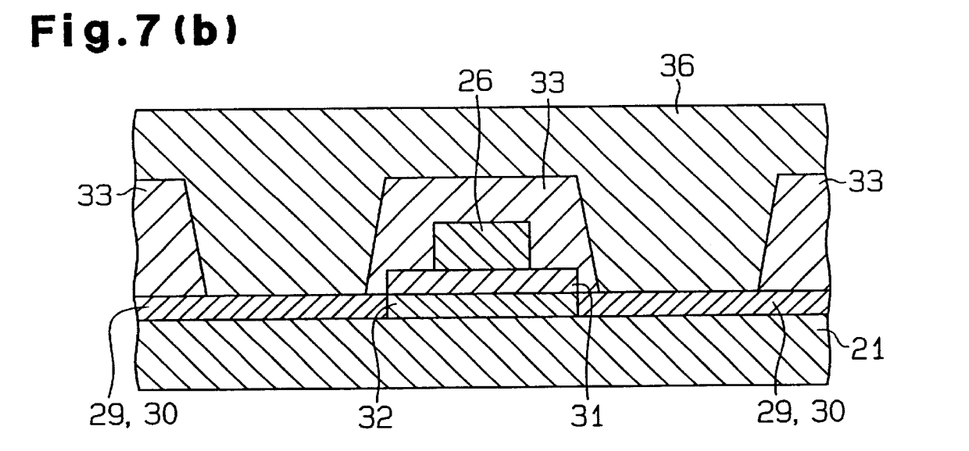
Figure 7C:
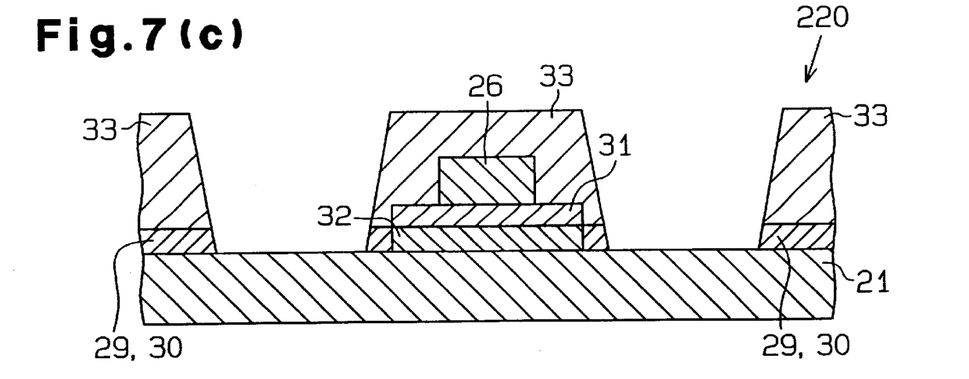

Subsequently, as shown in FIG. 7(b), a metal wiring layer 36, which preferably comprises aluminum, is formed in order to form metal electrodes over the semiconductor layers 29 and 30 and the interlayer insulating film 33. In a subsequent step in which the metal wiring layer 36 is etched to define a source/drain wiring, the impurity doped semiconductor layers 29 and 30 and the metal wiring layer 36 are removed by a dry etching technique, as shown in FIG. 7(c). During the dry etching step, a chlorine containing etching gas is used to etch away the impurity doped semiconductor layers 29 and 30 together with the metal wiring layer 36.

At this time, the wiring which is connected to the source and the drain electrode of the pixel TFTs 23 contained in the pixel cell array 21a and the data lines 27 are patterned. The subsequent steps remain the same as in the first embodiment.

In the manufacturing steps mentioned above, up to the step shown in FIG. 7(b), the process is similar to the first embodiment. In the etching step shown in FIG. 7(c), the gate control line 26 may be charged by static electricity, but it is to be noted that such static electricity is generated at the commencement of the step. It will be seen that if the gate control line 26 is charged by static electricity at the commencement of the etching step, there remain the metal wiring layer 36 and the impurity doped semiconductor layers 29 and 30 of the antenna-TFT 28 still at this time. Accordingly, the static electricity which charges the gate control line 26 leaks to the impurity doped semiconductor layers 29 and 30 of the antenna-TFT 28, thus protecting the pixel TFT 23 from electrostatic destruction.

In this manner, after the data line 27 is formed, the antenna-TFT 28 is only provided with the gate electrode, but does not form a TFT. Accordingly, during use of the substrate 21, the antenna-TFT 28 which is a load on the gate control line 26 does not exist, thus allowing the gate control line 26 to be driven at a higher rate by a gate control circuit.

Third Embodiment

Figure 8:
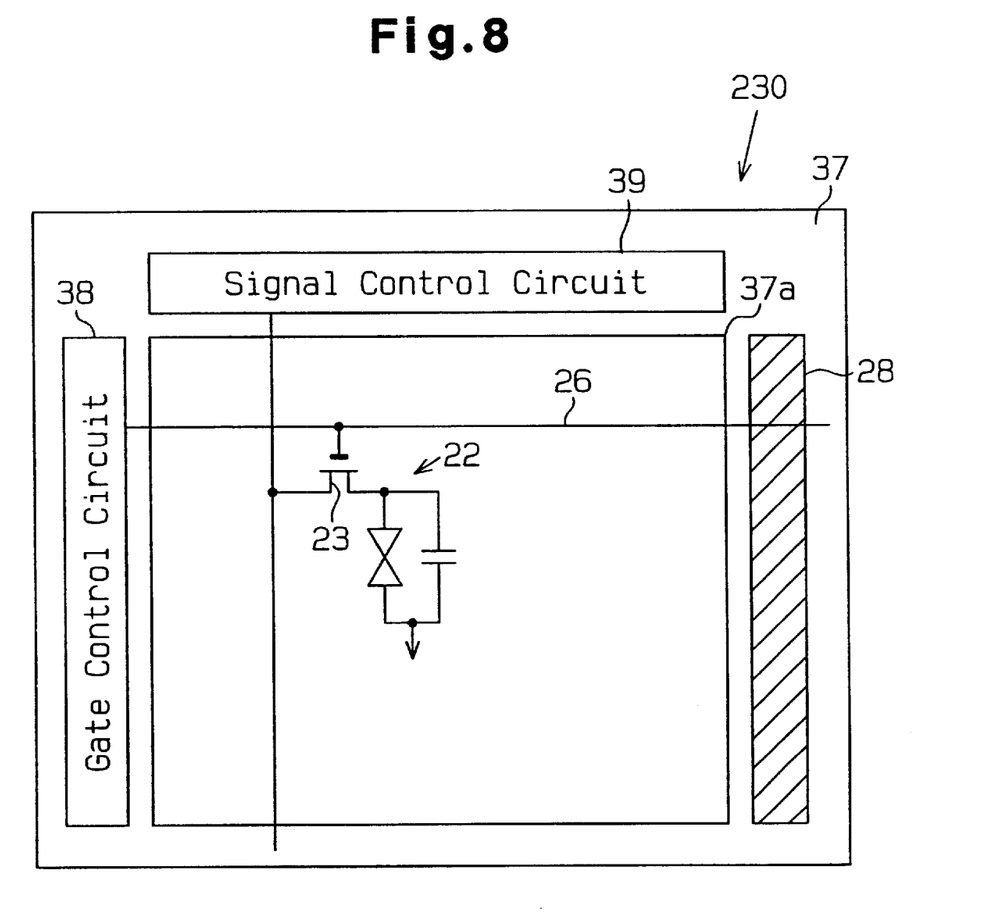
FIG. 8 is a schematic diagram of an AM-LCD according to a third embodiment of the present invention.

An AM-LCD 230 according to a third embodiment of the present invention is illustrated in FIG. 8. As shown, it comprises a substrate 37, a pixel cell array 37a of polysilicon elements formed on the substrate 37, a gate control circuit 38 and a signal control circuit 39. In addition, the AM-LCD 230 includes at least one antenna-TFT 28 which is connected to the terminal end of the gate control line 26. Polysilicon elements may be used to form the pixel cell array 37 with a similar effect as in the previous embodiments. The third embodiment protects the gate control circuit 38 and the signal control circuit 39 from destruction or damage which may be caused by static electricity charging the gate control line 26.

Fourth Embodiment

Figure 9:
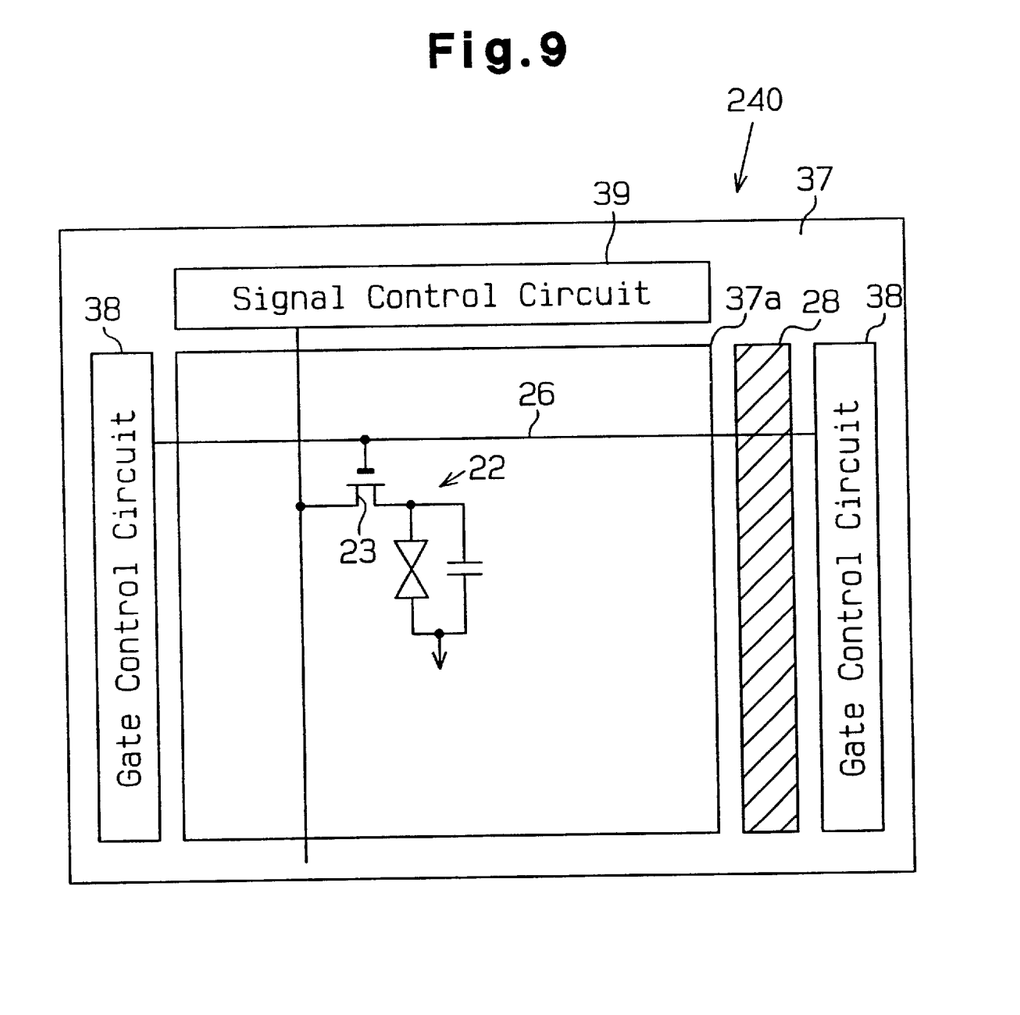
FIG. 9 is a schematic diagram of an AM-LCD according to a fourth embodiment of the present invention.

An AM-LCD 240 according to a fourth embodiment is shown in FIG. 9 where two gate control circuits 38 are formed on opposite ends of the gate control line 26. At least one antenna-TFT 28 is connected to the terminal end of the gate control line 26 and is disposed between the right-hand gate control circuit 38 and the pixel cell array 37a. The pair of gate control circuits 38 have redundant functions. Again, the fourth embodiment achieves a similar effect as achieved by the AM-LCD 240 of the third embodiment.

Fifth Embodiment

Figure 10:
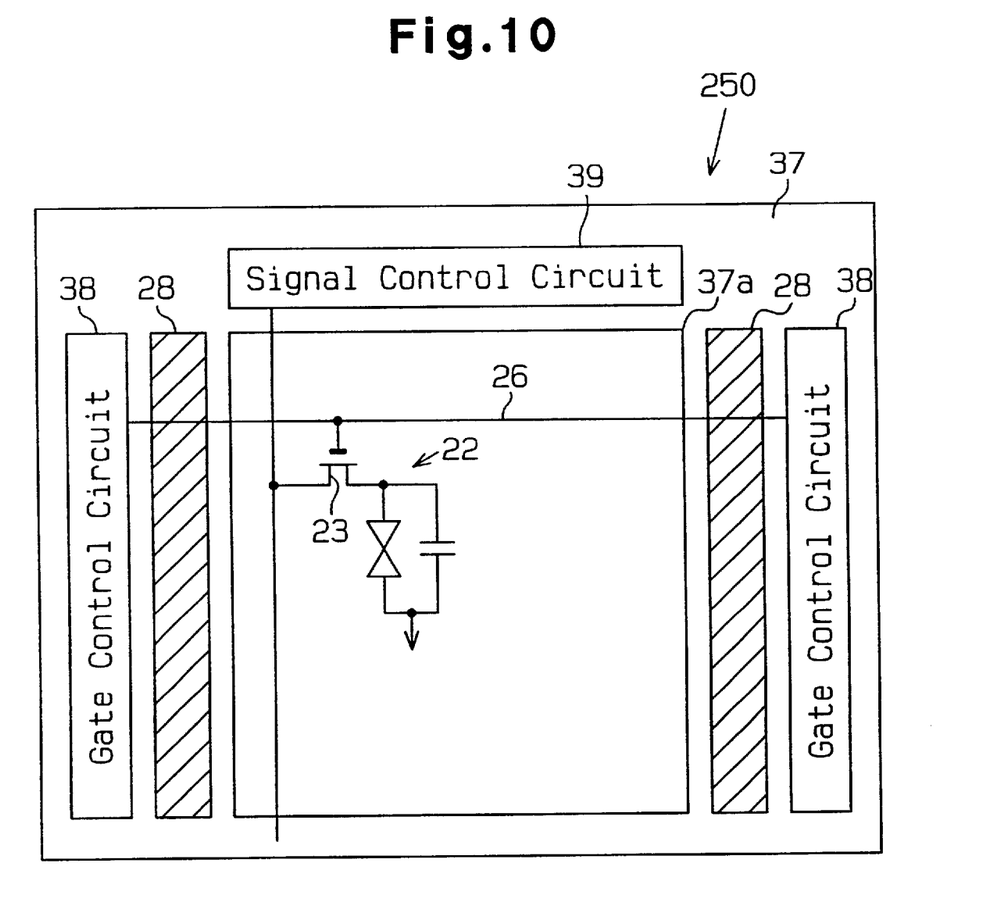
FIG. 10 is a schematic diagram of an AM-LCD according to a fifth embodiment of the present invention.

As shown in FIG. 10, an AM-LCD 250 according to a fifth embodiment includes a gate control circuit 38 and a termination unit 28 at each end of a gate control line 26. In the fifth embodiment, the antenna-TFT 28 and the gate control circuits 38 are disposed symmetrically. The gate control circuits 38 have redundant functions. The fifth embodiment achieves a similar effect as the third embodiment. For a larger AM-LCD, the effect of guarding against static electricity is further improved.

In each embodiment described above, the antenna-TFT 28 may comprise a PMOS TFT which is only provided with P-type impurity doped semiconductor layers on the opposite sides of the gate control line 26 or may comprise an NMOS TFT which is only provided with N-type impurity doped semiconductor layers on the opposite sides of the gate control line 26.

The present examples and embodiments are to be considered as illustrative and not restrictive and the invention is not to be limited to the details given herein, but may be modified within the scope and equivalence of the appended claims.

What is claimed is:

1. A liquid crystal display, comprising:
   a substrate;
   a pixel cell array disposed on the substrate, the pixel cell array including a plurality of pixel TFTs arranged in rows and columns;
   a plurality of gate control lines, each of the gate control lines having a first end and a second end, and extending along a respective row of the pixel cell array and connected to the pixel TFT of that row;
   a plurality of data lines, each of the data lines extending along a respective column of the pixel cell array and connected to the pixel TFTs of that column; and
   a termination unit including a plurality of antenna TFTs, each having a gate connected to the pixel TFTs by way of an associated gate control line and having a floating source electrode and a floating drain electrode,
   wherein the termination unit discharges static electricity from the gate control lines such that damage to the pixel TFTs caused by static electricity is prevented.

2. The liquid crystal display of claim 1, wherein the termination unit comprises, at one of the first and second ends of each of the gate control lines, a P-type impurity doped semiconductor layer and an N-type impurity doped semiconductor layer arranged on both sides of the gate control line, a first metal electrode disposed over the P-type layer and the N-type layer on one side of each gate control line, and a second metal electrode disposed over the P-type layer and the N-type layer on the other side of each gate control line.

3. The liquid crystal display of claim 2, wherein an area of each of the P-type and N-type layers is much larger than an area of any one of the pixel TFTs.

4. The liquid crystal display of claim 1, wherein the plurality of antenna TFTs are respectively connected to the gate control lines near the first ends of the gate control lines.

5. The liquid crystal display of claim 4, wherein the antenna TFTs have a size which is much larger than a size of the pixel TFTs.

6. The liquid crystal display of claim 4, wherein each of the antenna TFTs comprises a CMOS type TFT.

7. The liquid crystal display of claim 6, wherein each of the CMOS type antenna TFTs comprises:
   an active layer including an N-type impurity doped region and a P-type impurity doped region which are perpendicular to the gate control lines and adjacent to each other;
   a gate insulating film located on the active layer between the N-type impurity doped region and the P-type impurity doped region, wherein one of the gate control lines is located on the gate insulating film;
   an interlayer insulating film covering the gate control line and the gate insulating film, the interlayer insulating film having a first hole over the N-type impurity doped region and the P-type impurity doped region on one side of each gate control line, and a second hole over the N-type impurity doped region and the P-type impurity doped region on the other side of each gate control line;
   a first metal electrode disposed in the first hole; and
   a second metal electrode disposed in the second hole.

8. The liquid crystal display of claim 4, wherein each of the antenna TFTs comprises a PMOS type TFT having P-type impurity doped semiconductor layers or a NMOS type TFT having N-type impurity doped semiconductor layers located on opposing sides of the respective gate control lines.

9. The liquid crystal display of claim 4, further comprising a first gate control circuit formed on the substrate and connected to the second ends of the gate control lines.

10. The liquid crystal display of claim 9, further comprising a signal control circuit formed on the substrate and connected to the data lines.

11. The liquid crystal display of claim 9, further comprising a second gate control circuit formed on the substrate and connected to the gate control lines near the first ends of the gate control lines, wherein the pixel cell array and the termination unit are located between the first and second gate control circuits.

12. The liquid crystal display of claim 11, further comprising a second termination unit including a second plurality of antenna TFTs respectively connected to gate control lines near the second ends of the gate control lines, wherein the pixel cell array is located between the first and second termination units and the first and second termination units are located between the first and second gate control circuits.

13. The liquid crystal display of claim 1, wherein each of the antenna TFTs includes a first floating metal electrode located on the floating source electrode and a second floating metal electrode located on the floating drain electrode.

14. A liquid crystal display, comprising:
   a substrate;
   a pixel cell array disposed on the substrate, the pixel cell array including a plurality of pixel TFTs arranged in rows and columns, wherein each of the pixel TFTs comprises an amorphous silicon TFT;
   a plurality of gate control lines, each of the gate control lines having a first end and a second end, and extending along a respective row of the pixel cell array and connected to the gates of the pixel TFTs of that row;
   a plurality of data lines, each of the data lines extending along a respective column of the pixel cell array and connected to the sources of the pixel TFTs of that column; and
   a termination unit comprising a plurality of antenna TFTs, each having a gate connected to one of the first and second ends of an associated gate control line and having a flotation source electrode and a floating drain electrode, wherein the termination unit discharges a static charge built up on the gate control lines, such that damage to the pixel TFTs caused by the static charge is prevented.

15. The liquid crystal display of claim 14, wherein the antenna TFTs have a size which is much larger than a size of the pixel TFTs.

16. The liquid crystal display of claim 15, wherein each of the CMOS type antenna TFTs comprises:

an active layer including an N-type impurity doped region and a P-type impurity doped region;

a gate insulating film located on the active layer between the N-type impurity doped region and a P-type impurity doped region;

wherein one of the gate control lines is located on the gate insulating film;

an interlayer insulating film covering the gate control line and the gate insulating film, the interlayer insulating film having a first hole over the N-type impurity doped region and the P-type impurity doped region on one side of each gate control line, and a second hole over the N-type impurity doped region and the P-type impurity doped region on the other side of each gate control line;

a first metal electrode disposed in the first hole; and a second metal electrode disposed in the second hole.

17. The liquid crystal display of claim 14, wherein each of the antenna TFTs includes a first floating metal electrode located on the floating source electrode and a second floating metal electrode located on the floating drain electrode.

18. A liquid crystal display, comprising:

a substrate;

a pixel cell array disposed on the substrate, the pixel cell array including a plurality of pixel TFTs arranged in rows and columns;

a plurality of gate control lines, each of the gate control lines having a first end and a second end, and extending along a respective row of the pixel cell array and connected to the pixel TFTs of said respective row;

a plurality of data lines, each of the data lines extending along a respective column of the pixel cell array and connected to the pixel TFTs of said respective column; and termination unit including a plurality of antenna TFTs, each of said antenna TFTs having a gate connected to a respective pixel TFT by way of an associated gate control line, wherein a source and a drain of each of the TFTs are etched away.

19. A liquid crystal display, comprising:

a substrate;

a pixel cell array disposed on the substrate, the pixel cell array including a plurality of pixel TFTs arranged in rows and columns, wherein each of the pixel TFTs comprises an amorphous silicon TFT;

a plurality of gate control lines, each of the gate control lines having a first end and a second end, and extending along a respective row of the pixel cell array and connected to respective gates of respective pixel TFTs of said respective row;

a plurality of data lines, each of the data lines extending along a respective column of the pixel cell array and connected to respective sources of respective pixel TFTs of said respective column; and a termination unit comprising a plurality of antenna TFTs, each of said antenna TFTs having a gate connected to one of the first and second ends of a respective associated gate control line, wherein a source and a drain of the TFTs are etched away.

* * * * *